US012787771B2

(12) United States Patent
Woo et al.

(10) Patent No.: US 12,787,771 B2
(45) Date of Patent: Nov. 3, 2026

(54) INVERTER POWER MODULE

(71) Applicant: AMOSENSE CO., LTD., Cheonan-si (KR)

(72) Inventors: Kyungwhan Woo, Cheonan-si (KR); Seunggon Park, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 406 days.

(21) Appl. No.: 18/564,057

(22) PCT Filed: May 17, 2022

(86) PCT No.: PCT/KR2022/007009
§ 371 (c)(1),
(2) Date: Nov. 24, 2023

(87) PCT Pub. No.: WO2022/250358
PCT Pub. Date: Dec. 1, 2022

(65) Prior Publication Data

US 2024/0258196 A1 Aug. 1, 2024

(30) Foreign Application Priority Data

May 27, 2021 (KR) ........................ 10-2021-0068195

(51) Int. Cl.
*H10W 40/25* (2026.01)
*H02M 7/00* (2006.01)
(Continued)

(52) U.S. Cl.
CPC ......... *H10W 40/255* (2026.01); *H02M 7/003* (2013.01); *H10W 70/611* (2026.01);
(Continued)

(58) Field of Classification Search
CPC ............... H10W 40/255; H10W 90/00; H10W 70/635; H10W 70/611; H10W 74/114;
(Continued)

(56) References Cited

U.S. PATENT DOCUMENTS 10,541,188 B2 1/2020 Hiyoshi
2003/0194832 A1* 10/2003 Lopata ................ H10W 70/657
257/E23.079
(Continued)

FOREIGN PATENT DOCUMENTS

EP 3 012 861 B1 1/2020
JP 2017-152528 A 8/2017
(Continued)

OTHER PUBLICATIONS ip.com search history (Year: 2026).*
KR Office Action dated Aug. 22, 2024 in application 1020210068195.

*Primary Examiner* — Zandra V Smith
*Assistant Examiner* — Andre C Stevenson
(74) *Attorney, Agent, or Firm* — Maschoff Brennan

(57) ABSTRACT

The present disclosure relates to an inverter power module, and includes a ceramic substrate (110), an LTCC substrate (120) disposed to be spaced apart from an upper portion of the ceramic substrate (110), and a semiconductor chip (130) having a lower surface bonded to a metal pattern (112) on an upper surface of the ceramic substrate (110) and an upper surface bonded to an external electrode (123) of the LTCC substrate (120). The present disclosure has the advantage of being able to provide an inverter power module with more improved functions and operational reliability by using a ceramic substrate and an LTCC substrate.

13 Claims, 5 Drawing Sheets

(51) Int. Cl.

| | |
|---|---|
| ***H10W 70/40*** | (2026.01) |
| ***H10W 70/60*** | (2026.01) |
| ***H10W 70/63*** | (2026.01) |
| ***H10W 72/00*** | (2026.01) |
| ***H10W 72/30*** | (2026.01) |
| ***H10W 74/10*** | (2026.01) |
| ***H10W 90/00*** | (2026.01) |

(52) U.S. Cl.
CPC ......... *H10W 70/635* (2026.01); *H10W 90/00* (2026.01); *H10W 70/479* (2026.01); *H10W 72/07354* (2026.01); *H10W 72/347* (2026.01); *H10W 72/352* (2026.01); *H10W 72/357* (2026.01); *H10W 74/114* (2026.01); *H10W 90/734* (2026.01)

(58) Field of Classification Search
CPC ......... H10W 72/347; H10W 72/07354; H10W 72/357; H10W 90/734; H10W 70/479; H10W 72/352; H02M 7/003
See application file for complete search history.

(56) References Cited

U.S. PATENT DOCUMENTS

| | | | | |
|---|---|---|---|---|
| 2003/0218057 | A1 | 11/2003 | Joseph et al. | |
| 2007/0120250 | A1* | 5/2007 | Fairchild .............. | H05K 1/0206 257/E23.105 |
| 2007/0247268 | A1* | 10/2007 | Oya .................... | H01F 17/0006 336/200 |
| 2008/0253085 | A1* | 10/2008 | Soffer ........................ | G06F 1/18 361/679.46 |
| 2013/0001756 | A1* | 1/2013 | Chen ..................... | H10W 42/20 257/666 |
| 2015/0179607 | A1* | 6/2015 | Ho ...................... | H10P 90/1914 438/118 |
| 2016/0126157 | A1 | 5/2016 | Jeon | |
| 2020/0303313 | A1* | 9/2020 | Leitgeb .................... | G02B 6/12 |
| 2021/0091054 | A1* | 3/2021 | Apelsmeier ........... | H10W 40/00 |

FOREIGN PATENT DOCUMENTS

| | | | |
|---|---|---|---|
| KR | 1020050112093 | A | 11/2005 |
| KR | 10-2016-0050282 | A | 5/2016 |
| KR | 10-2018-0030298 | A | 3/2018 |
| KR | 10-1956983 | B1 | 3/2019 |

* cited by examiner

[FIG. 1]
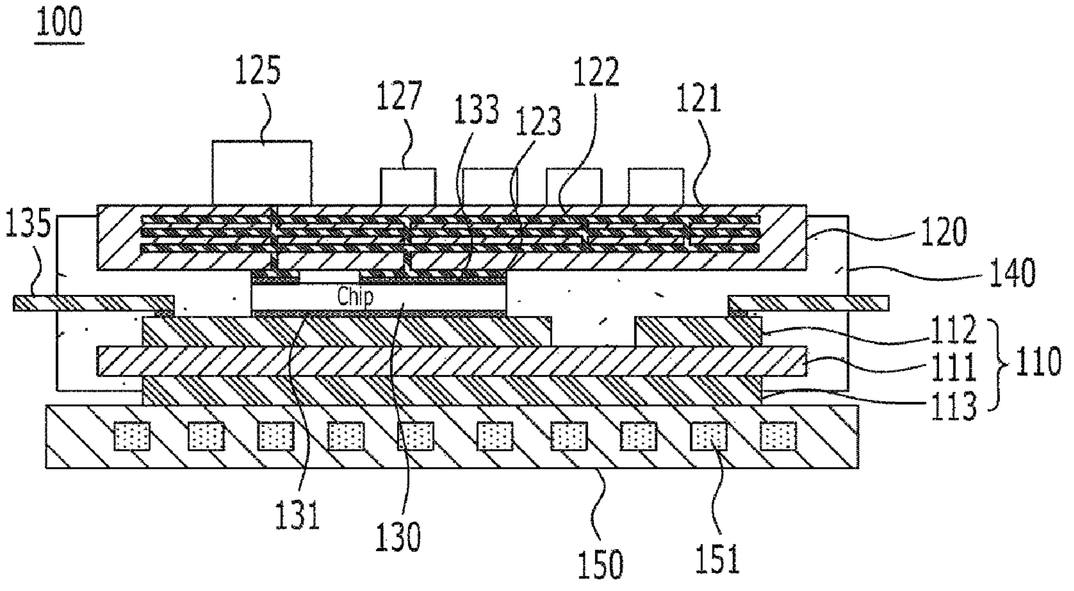
120(121,122,123)

[FIG. 2]
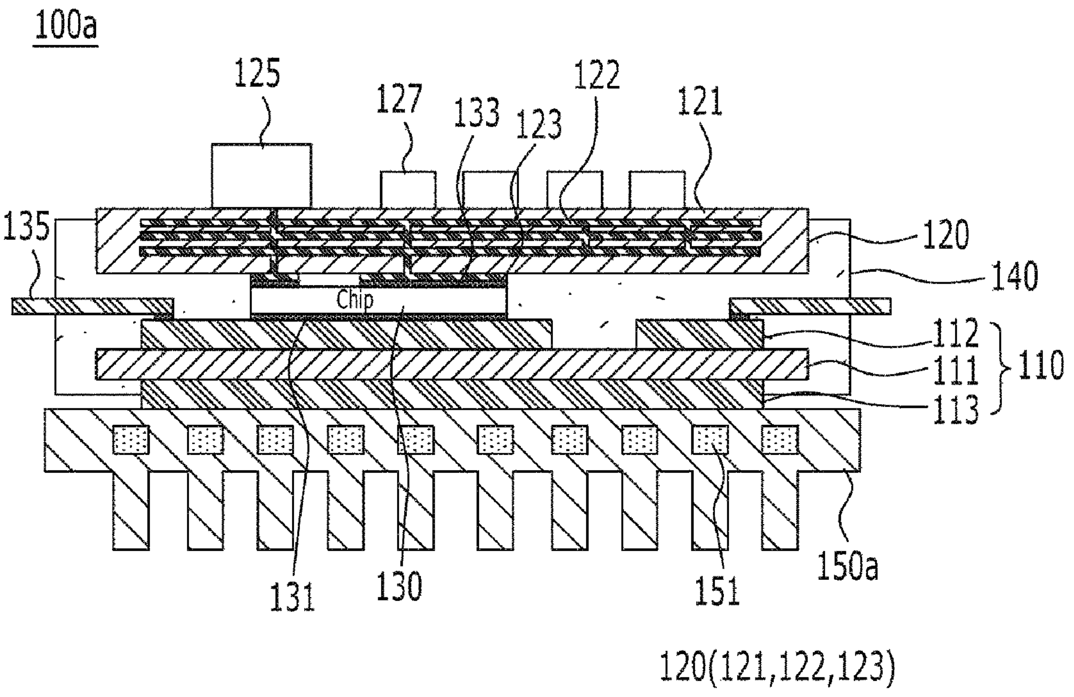

[FIG. 3]
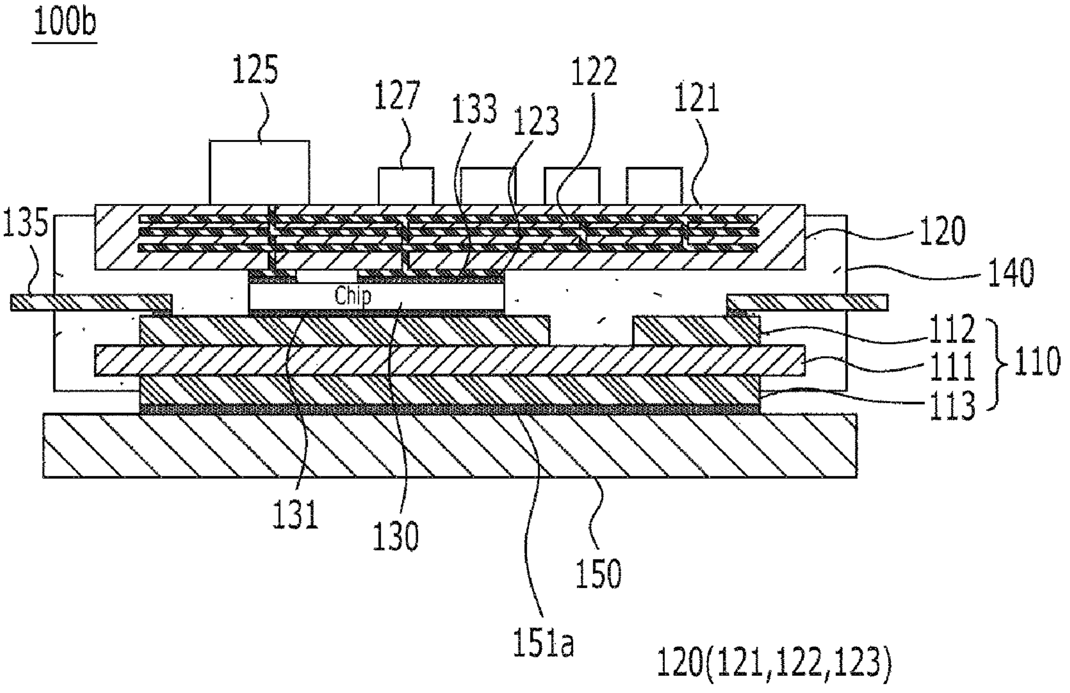

[FIG. 4]
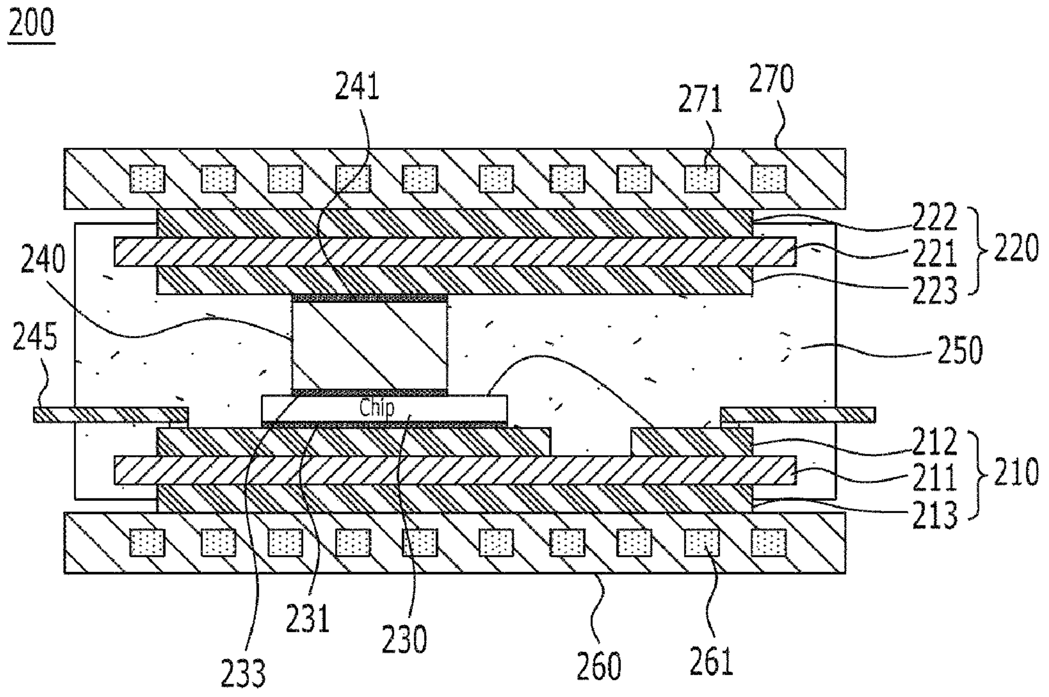

[FIG. 5]
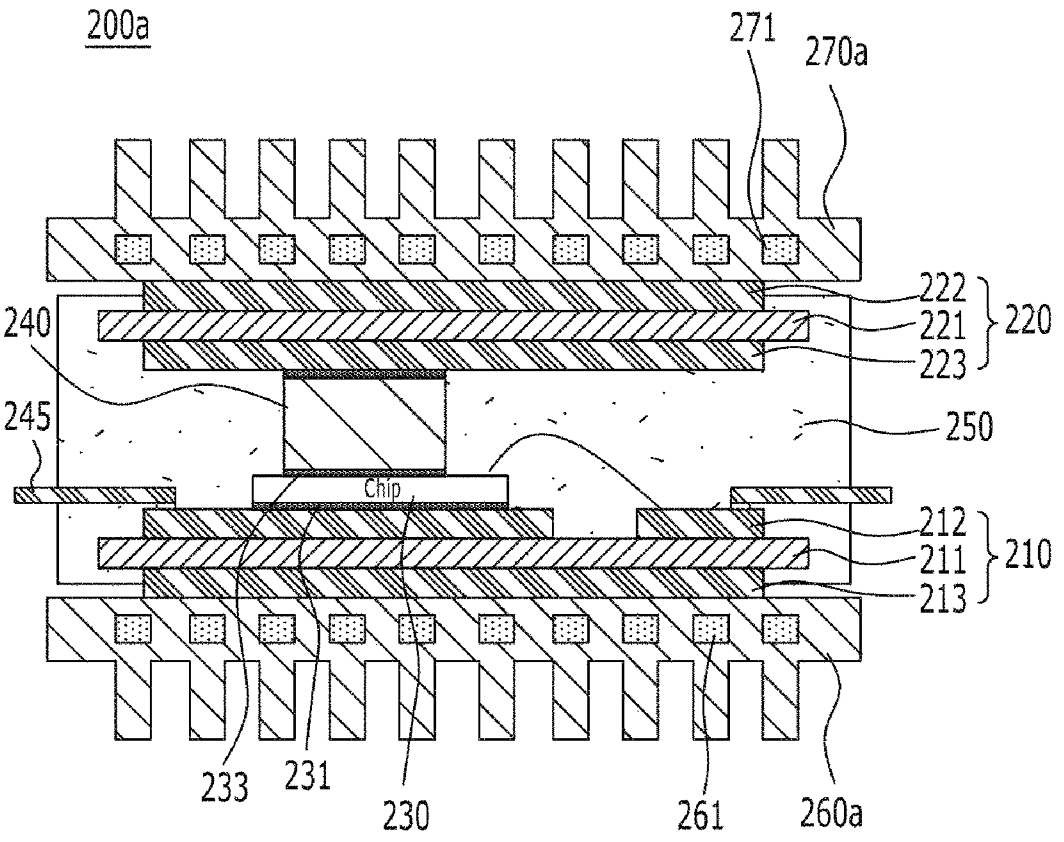

INVERTER POWER MODULE

TECHNICAL FIELD

Embodiments of the present disclosure relate to a power module, and more particularly, to an inverter power module that improves functions and reliability.

BACKGROUND ART

An inverter power module is a core module of an inverter for converting battery direct current power into alternating current power for a motor in controlling a motor for an electric vehicle driving device. The inverter power module more stably controls a motor driving system by integrating a gate control circuit and a protection circuit into a general power module including individual power semiconductor chips in order to improve control for the driving system.

However, since an electric current of the power semiconductor chip used for the inverter power module is quite high power, effective heat dissipation is required in order to prevent an abnormal operation or destruction of the power semiconductor chip that may occur due to the heat.

DISCLOSURE

Technical Problem

An object of the present disclosure is to provide an inverter power module that improves process stabilization and high-temperature reliability by using a substrate with improved high-temperature performance and further improves functions and operational reliability by improving heat dissipation efficiency through an improvement of a bonding structure and a heat dissipation plate structure of a semiconductor chip.

Technical Solution

An inverter power module according to embodiments of the present disclosure includes a ceramic substrate, an LTCC substrate disposed to be spaced apart from an upper portion of the ceramic substrate, and a semiconductor chip having a lower surface bonded to a metal pattern on an upper surface of the ceramic substrate and an upper surface bonded to an external electrode of the LTCC substrate.

The ceramic substrate is an active metal brazing (AMB) substrate.

The semiconductor chip may be a SiC chip.

The inverter power module further includes a bonding layer configured to bond a surface electrode on a lower surface of the semiconductor chip to a metal pattern on the upper surface of the ceramic substrate, and an adhesive layer configured to bond a signal transmission electrode on an upper surface of the semiconductor chip to an external electrode on a lower surface of the LTCC substrate.

The bonding layer is made of silver nanopaste, and the adhesive layer is made of silver nanopaste or solder.

The inverter power module further includes a heat dissipation plate bonded to a lower surface of the ceramic substrate.

The heat dissipation plate may include a thermal interface material (TIM).

The inverter power module further includes a circuit protection element (MLCC) mounted on an upper surface of the LTCC substrate, and the circuit protection element is connected to a signal transfer electrode on an upper surface of the semiconductor chip through an external electrode connected to an internal electrode of the LTCC substrate.

The inverter power module further includes a lead frame bonded to the metal pattern on the upper surface of the ceramic substrate and extending outward; and a mold compound configured to surround and integrate the ceramic substrate, the LTCC substrate, and the semiconductor chip and to expose an end of the lead frame to an outside.

An inverter power module includes a lower ceramic substrate, an upper ceramic substrate disposed to be spaced apart from an upper portion of the lower ceramic substrate, a semiconductor chip bonded to a metal pattern on an upper surface of the lower ceramic substrate, and a conductive spacer installed between the semiconductor chip and the upper ceramic substrate to connect a signal transfer electrode on an upper surface of the semiconductor chip and a metal pattern of the upper ceramic substrate.

The inverter power module further includes a first heat dissipation plate bonded to a lower surface of the lower ceramic substrate, and a second heat dissipation plate bonded to an upper surface of the upper ceramic substrate.

The first heat dissipation plate and the second heat dissipation plate may each include a thermal interface material (TIM).

The upper ceramic substrate and the lower ceramic substrate may each be an active metal brazing (AMB) substrate.

The semiconductor chip is a SiC chip.

The inverter power module further includes a bonding layer configured to bond a surface electrode of the semiconductor chip to a metal pattern on an upper surface of the lower ceramic substrate, a first adhesive layer configured to bond the signal transmission electrode on the upper surface of the semiconductor chip to a lower surface of the conductive spacer, and a second adhesive layer configured to bond an upper surface of the conductive spacer to a metal pattern on a lower surface of the upper ceramic substrate.

The bonding layer, the first adhesive layer, and the second adhesive layer are each made of silver nanopaste.

The inverter power module further includes a lead frame bonded to the metal pattern on the upper surface of the lower ceramic substrate and extending outward, and a mold compound configured to surround and integrate the lower ceramic substrate, the upper ceramic substrate, the semiconductor chip, and the conductive spacer and to expose an end of the lead frame to an outside.

Advantageous Effects

According to embodiments of the present disclosure, there is an effect of increasing efficiency by using a SiC chip as a semiconductor chip, improving process stabilization and reliability by using an AMB substrate, increasing high temperature tolerance and facilitating signal transfer of the SiC chip by using an LTCC substrate, and stably bonding a semiconductor chip to a ceramic substrate by using silver nanopaste, thereby increasing reliability even when an operating temperature rises.

According to embodiments of the present disclosure, there are effects of increasing efficiency by using a SiC chip as a semiconductor chip, improving process stabilization and reliability by using an AMB substrate, and dissipating heat generated from the semiconductor chip on both top and bottom sides by employing a structure in which a semiconductor chip and a conductive spacer are vertically connected and disposed between two AMB substrates, thereby increasing heat dissipation efficiency and improving operational reliability.

DESCRIPTION OF DRAWINGS

FIG. 1 is a view illustrating the cross-sectional structure of an inverter power module according to an embodiment of the present disclosure.

FIG. 2 is a view illustrating the cross-sectional structure of a first modified example of an inverter power module according to an embodiment of the present disclosure.

FIG. 3 is a view illustrating the cross-sectional structure of a second modified example of an inverter power module according to an embodiment of the present disclosure.

FIG. 4 is a view illustrating the cross-sectional structure of an inverter power module according to another embodiment of the present disclosure.

FIG. 5 is a view illustrating the cross-sectional structure of a modified example of an inverter power module according to another embodiment of the present disclosure.

MODE FOR INVENTION

Hereinafter, preferred embodiments of the present disclosure are described in detail with reference to the accompanying drawings.

FIG. 1 is a view illustrating the cross-sectional structure of an inverter power module 100 according to an embodiment of the present disclosure.

As illustrated in FIG. 1, the inverter power module 100 according to an embodiment of the present disclosure includes a ceramic substrate 110, a low temperature co-fired ceramics (LTCC) substrate 120, and a semiconductor chip 130, and the ceramic substrate 110, the LTCC substrate 120, and the semiconductor chip 130 are surrounded by a mold compound 140 to form a packaged unit. The packaged unit is metallically bonded to a heat dissipation plate 150.

Specifically, the inverter power module 100 has a structure in which the semiconductor chip 130 is disposed between the ceramic substrate 110 and the LTCC substrate 120 and the heat dissipation plate 150 is bonded to a lower surface of the ceramic substrate 110. Such an inverter power module 100 increases structural stability at a high temperature by using the ceramic substrate 110, increases high temperature tolerance and facilitates signal transfer by using the LTCC substrate 120, and efficiently dissipates heat generated from the semiconductor chip 130 by using the heat dissipation plate 150.

The ceramic substrate 110 has a function of mounting the semiconductor chip 130 to form a power conversion circuit, securing insulation from the ground, and transferring heat generated from the semiconductor chip 130 to the heat dissipation plate 150.

The ceramic substrate 110 uses an active metal brazing (AMB) substrate in order to improve durability and increase heat dissipation efficiency.

The ceramic substrate 110 includes a ceramic base material 111 and metal layers 112 and 113 brazed to upper and lower surfaces of the ceramic base material 111, respectively. The ceramic base material 111 may be, for example, any one of alumina ($Al_2O_3$), AlN, SiN, and $Si_3N_4$. The metal layers 112 and 113 are metal foils brazed onto the ceramic base material 111 and form metal patterns for mounting the semiconductor chip 130. As an example, the metal foil is a copper foil or an aluminum foil that is fired at 780° C. to 1100° C. on the ceramic base material 111 and brazed to the ceramic base material 111. Such a ceramic substrate 110 is referred to as an AMB substrate. A direct bonded copper (DBC) substrate, a thick printing copper (TPC) substrate, and a DBA substrate may be applied as the ceramic substrate, but the AMB substrate is most suitable in terms of durability and heat dissipation efficiency. The AMB substrate has high durability to enable process stabilization when an inverter power module is manufactured, and has excellent high-temperature stability and high heat dissipation efficiency to improve the reliability of a manufactured inverter power module.

The metal layer 112 on the upper surface of the ceramic substrate 110 forms a power conversion circuit with the semiconductor chip 130, and the metal layer 113 on the lower surface of the ceramic substrate 110 quickly transfers heat generated from the semiconductor chip 130 to the heat dissipation plate 150. The ceramic base material 111 in the middle increases heat dissipation efficiency and insulates the metal layer 112 on the upper surface from the metal layer 113 on the lower surface to insulate the heat dissipation plate 150 from the semiconductor chip 130, thereby preventing short circuits.

The LTCC substrate 120 is disposed to be spaced apart from an upper portion of the ceramic substrate 110. The LTCC substrate 120 serves as a gate board that outputs a signal for switching the semiconductor chip 130. An upper surface of the LTCC substrate 120 may include a gate drive IC 125 that outputs a signal for switching the semiconductor chip 130, thereby allowing the semiconductor chip 130 to be switched.

The LTCC substrate 120 refers to a substrate manufactured by simultaneously firing a metal electrode and a ceramic base material at a temperature of 1000° C. or lower, which is more than 200° C. lower than a firing temperature typically applied when firing ceramics. The substrate 120 manufactured as described above has an internal electrode 122 formed inside a ceramic base material 121 and an external electrode 123 formed on at least one of the upper and lower surfaces of the ceramic base material 111 to be connected to the internal electrode 122. A gate drive IC 125 may be connected to the semiconductor chip 130 through the internal electrode 122 and the external electrode 123 of the LTCC substrate 120, and may control an operation of the semiconductor chip 130.

A circuit protection element (multilayer ceramic capacitor (MLCC)) 127 is further mounted on the upper surface of the LTCC substrate 120. Since the circuit protection element 127 has a very small temperature change rate, when the circuit protection element 127 is used for an inverter power module where temperature changes are severe, the circuit protection element 127 performs a function of enhancing tolerance to high temperature and stably processing signals without attenuation. A plurality of the circuit protection element 127 may be mounted on the LTCC substrate 120 in order to match capacity.

The circuit protection element 127 is small in size and replaces a large capacitor, so it is advantageous for miniaturizing the inverter power module 100, and has excellent high temperature stability, so it can minimize an insulation distance between the semiconductor chip 130 and the LTCC substrate 120.

The semiconductor chip 130 uses a SiC chip. SiC has a band gap three times that of Si, a breakdown field strength 10 times or more that of Si, and characteristics of operating at a high temperature. In particular, when applied to power conversion devices, power loss can be significantly reduced. In this way, since SiC has the characteristics of high voltage and low loss, can operate at a high temperature, and has excellent efficiency and power density, it can contribute to miniaturizing the inverter power module, increasing efficiency, and reducing the weight of a system.

The semiconductor chip 130 is disposed between the ceramic substrate 110 and the LTCC substrate 120 in such a manner that a lower surface thereof is bonded to the metal pattern 112 on the upper surface of the ceramic substrate 110 and an upper surface thereof is bonded to the external electrode 123 of the LTCC substrate 120.

In the semiconductor chip 130, a surface electrode on the lower surface is bonded to the metal pattern 112 on the upper surface of the ceramic substrate 110 through a bonding layer 131, and a signal transmission electrode on the upper surface is bonded to the external electrode 123 on a lower surface of the LTCC substrate 120 via an adhesive layer 133.

The bonding layer 131 may be made of silver nanopaste. Silver nanopaste has superior high-temperature reliability and higher thermal conductivity than solder, so it can stably maintain the semiconductor chip 130 mounted on the ceramic substrate 110 and quickly transfer heat generated from the semiconductor chip 130 to the heat dissipation plate 150 through the ceramic substrate 110. The bonding layer 131 made of silver nanopaste uses a sintering bonding method, so it has higher strength, better heat resistance, and lower heat resistance than a soldering bonding layer, and is highly reliable even when an operating temperature rises, thereby ensuring high heat dissipation.

The adhesive layer 133 may be made of silver nanopaste or solder. The adhesive layer 133 serves to connect the external electrode 123 of the LTCC substrate 120 and the semiconductor chip 130. The solder may use SnPb-based, SnAg-based, SnAgCu-based, or Cu-based solder paste having high bonding strength and excellent high-temperature reliability. Since the adhesive layer 133 preferably has lower thermal conductivity to the LTCC substrate 120, solder with lower thermal conductivity than silver nanopaste is preferably used.

The mold compound 140 is used to protect the semiconductor chip 130 disposed between the ceramic substrate 110 and the LTCC substrate 120 and to insulate circuits. The mold compound 140 may be made of highly heat-resistant silicone-based resin or epoxy-based resin.

The heat dissipation plate 150 is bonded to the lower surface of the ceramic substrate 110. The heat dissipation plate 150 is used to dissipate heat generated from the semiconductor chip 130. The heat dissipation plate 150 may be made of a metal with high heat dissipation efficiency, and for example, may be made of copper, copper alloy, and aluminum.

The heat dissipation plate 150 may be soldered to the lower surface of the ceramic substrate 110. Accordingly, heat generated from the semiconductor chip 130 may be discharged to the outside through the path of the bonding layer 131, the ceramic substrate 110, and the heat dissipation plate 150. Solder for soldering bonding may use SnAg, SnAgCu, or the like.

The heat dissipation plate 150 may be formed therein with a plurality of spaces in a vertical direction or a horizontal direction, and a thermal interface material (TIM) 151 may be applied to these spaces. As an example of the thermal interface material 151, a heat dissipation grease may be used, and the heat dissipation grease may be a silicone-based grease or a non-silicone-based grease including no siloxane. The heat dissipation grease may lower thermal resistance and increase heat dissipation efficiency.

In the inverter power module 100 described above, the lower surface of the semiconductor chip 130 may be sintered and bonded to the upper surface of the ceramic substrate 110 by using silver nanopaste, the upper surface of the semiconductor chip 130 bonded to the ceramic substrate 110 may be bonded to the external electrode of the LTCC substrate 120 via the adhesive layer 133, and the semiconductor chip 130 may be disposed between the ceramic substrate 110 and the LTCC substrate 120. Subsequently, the inverter power module 100 may be manufactured by surrounding the ceramic substrate 110, the LTCC substrate 120, and the semiconductor chip 130 with the mold compound 140 to form a packaged unit and bonding the heat dissipation plate 150 to the lower surface of the ceramic substrate 110.

In such a case, the mold compound 140 has a structure of surrounding the upper surface of the LTCC substrate 120 and the lower surface of the ceramic substrate 110 to be exposed to the outside, and enables electrical connection with other devices and bonding of the heat dissipation plate 150 while performing a protective function and an insulating function of the semiconductor chip 130.

The inverter power module 100 further includes a lead frame 135 that is bonded to the metal pattern on the upper surface of the ceramic substrate 110 and extends outward. An end of the lead frame 135 extending outward is connected to a terminal responsible for input and output of power. Specifically, the end of the lead frame 135 extending outward is exposed to the outside of the mold compound 140 that surrounds and integrates the ceramic substrate 110, the LTCC substrate 120, and the semiconductor chip 130 and is connected to the terminal responsible for input and output of power.

Since the above-described inverter power module 100 has high efficiency by using a SiC chip, improves process stabilization and reliability by using an AMB substrate, increases high temperature tolerance and facilitates signal transfer of the SiC chip by using an LTCC substrate, and bonds a semiconductor chip to a ceramic substrate by using silver nanopaste, the inverter power module 100 is highly reliable even when an operating temperature rises. Moreover, by using the circuit protection element 127 instead of a capacitor in the related art, the inverter power module 100 can be reduced in size and perform a function of enhancing tolerance to high temperature and stably processing signals without attenuation.

The present disclosure can further increase heat dissipation efficiency by applying the thermal interface material 151 to the heat dissipation plate 150 to reduce thermal resistance.

FIG. 2 is a view illustrating the cross-sectional structure of a first modified example of an inverter power module 100*a* according to an embodiment of the present disclosure.

As illustrated in FIG. 2, the inverter power module 100*a*, which is the first modified example of the embodiment, may have a heat dissipation plate 150*a* in the shape of a heat sink. The heat dissipation plate 150*a* in the shape of a heat sink is provided on the surface thereof with protrusions at regular intervals and increases a surface area through which heat is dissipated, thereby enabling efficient heat dissipation.

FIG. 3 is a view illustrating the cross-sectional structure of a second modified example of an inverter power module 100*b* according to an embodiment of the present disclosure.

As illustrated in FIG. 3, in the inverter power module 100*b*, which is the second modified example of the embodiment, the heat dissipation plate 150 may be bonded to the lower surface of the ceramic substrate 110 via a thermal interface material 151*a*. The thermal interface material 151*a* may be a heat dissipation grease.

Although not illustrated, heat dissipation efficiency may also be increased by fixing the heat dissipation plate 150 to the lower surface of the ceramic substrate 110 via a heat dissipation grease and bonding a heat sink to the heat dissipation plate 150 by soldering or the like.

The inverter power module of the above-described embodiment has a structure in which heat generated from the semiconductor chip 130 is dissipated downward using the heat dissipation plate 150 bonded to the lower surface of the ceramic substrate 110.

In another embodiment, the inverter power module may have a structure of dissipating heat generated from the semiconductor chip in both vertical and horizontal directions.

FIG. 4 is a view illustrating the cross-sectional structure of an inverter power module 200 according to another embodiment of the present disclosure.

As illustrated in FIG. 4, the inverter power module 200 according to another embodiment includes a lower ceramic substrate 210, an upper ceramic substrate 220, a semiconductor chip 230, and a conductive spacer 240. The lower ceramic substrate 210, the upper ceramic substrate 220, and the semiconductor chip 230 are surrounded by a mold compound 250 to form a packaged unit. The packaged unit is metallically bonded to first and second heat dissipation plates 260 and 270.

Specifically, the inverter power module 200 has a structure in which the semiconductor chip 230 is bonded to an upper surface of the lower ceramic substrate 210, the conductive spacer 240 is disposed between the semiconductor chip 230 and the upper ceramic substrate 220, the first heat dissipation plate 260 is bonded to a lower surface of the lower ceramic substrate 210, and the second heat dissipation plate 270 is bonded to the upper surface of the upper ceramic substrate 220. In such an inverter power module 200, heat generated from the semiconductor chip 230 is discharged to the first heat dissipation plate 260 and the second heat dissipation plate 270, thereby further improving heat dissipation efficiency.

The lower ceramic substrate 210 has a function of mounting the semiconductor chip 230 to form a power conversion circuit, securing insulation from the ground, and transferring heat generated from the semiconductor chip 230 to the first heat dissipation plate 260. The upper ceramic substrate 220 has a function of receiving heat generated from the semiconductor chip 230 through the conductive spacer 240 and dissipating the heat to the outside through the second heat dissipation plate 270. The upper ceramic substrate 220 may also be electrically connected to a substrate (not illustrated), and may transfer a switching signal of the semiconductor chip 230 to the semiconductor chip 230 through the conductive spacer 240.

The upper ceramic substrate 220 and the lower ceramic substrate 210 each use active metal brazing (AMB) having excellent thermal conductivity and heat dissipation characteristics. The semiconductor chip 230 uses a SiC chip capable of operating at a high temperature. The semiconductor chip 230 is bonded to a metal pattern 211 on the upper surface of the lower ceramic substrate 210.

The conductive spacer 240 is installed between the semiconductor chip 230 and the upper ceramic substrate 220 to connect a signal transmission electrode on an upper surface of the semiconductor chip 230 and a metal pattern 223 of the upper ceramic substrate 220. The metal pattern 223 is a metal layer on a lower surface of the upper ceramic substrate 220.

In the semiconductor chip 230, a surface electrode on a lower surface is bonded to a metal pattern 212 on the upper surface of the lower ceramic substrate 210 via a bonding layer 231, and the signal transmission electrode on the upper surface is bonded to a lower surface of the conductive spacer 240 via a first adhesive layer 233. The lower surface of the conductive spacer 240 is bonded to the upper surface of the semiconductor chip 230 via the first adhesive layer 233, and an upper surface of the conductive spacer 240 is bonded to the metal pattern 223 on the lower surface of the upper ceramic substrate 220 via a second adhesive layer 241.

The bonding layer 231, the first adhesive layer 233, and the second adhesive layer 241 are each made of silver nanopaste having high high-temperature reliability and high thermal conductivity. When the bonding layer 231, the first adhesive layer 233, and the second adhesive layer 241 are each made of silver nanopaste, heat generated from the semiconductor chip 230 may be efficiently transferred to the first heat dissipation plate 260 through the bonding layer 231 and efficiently transferred to the second heat dissipation plate 270 through the first adhesive layer 233 and the second adhesive layer 241, thereby ensuring high heat dissipation.

The mold compound 250 is used to protect the semiconductor chip 230 disposed between the lower ceramic substrate 210 and the upper ceramic substrate 220 and to insulate circuits. The mold compound 250 may be made of highly heat-resistant silicone-based resin or epoxy-based resin. The mold compound 250 surrounds the lower ceramic substrate 210, the upper ceramic substrate 220, the semiconductor chip 230, and the conductive spacer 240, and does not surround the lower surface of the lower ceramic substrate 210 and the upper surface of the upper ceramic substrate 220. This is for enabling the lower ceramic substrate 210 and the upper ceramic substrate 220 to be bonded to other devices or heat dissipation plates.

The first heat dissipation plate 260 may be soldered to the lower surface of the lower ceramic substrate 110, and the second heat dissipation plate 270 may be soldered to the upper surface of the upper ceramic substrate 220. Accordingly, heat generated from the semiconductor chip 230 may be discharged to the outside through the path of the bonding layer 231, the lower ceramic substrate 210, and the first heat dissipation plate 260. The heat generated from the semiconductor chip 230 may be discharged to the outside through the path of the first adhesive layer 233, the conductive spacer 240, the second adhesive layer 241, the upper ceramic substrate 220, and the second heat dissipation plate 270.

The first heat dissipation plate 260 and the second heat dissipation plate 270 may each be formed therein with a plurality of spaces in a vertical direction or a horizontal direction, and thermal interface materials (TIM) 261 and 271 may be applied to these spaces, respectively. As an example of the thermal interface materials 261 and 271, a heat dissipation grease may be used, and the heat dissipation grease may be a silicone-based grease or a non-silicone-based grease including no siloxane. The heat dissipation grease may lower thermal resistance and increase heat dissipation efficiency.

In the inverter power module 200 described above, the semiconductor chip 230 is temporarily bonded to the upper surface of the lower ceramic substrate 210 by using silver nanopaste, the conductive spacer 240 is temporarily bonded to the upper surface of the semiconductor chip 230 by using silver nanopaste, the upper ceramic substrate 220 is temporarily bonded to the upper surface of the conductive spacer 240, and then a sintering process is performed, so that the semiconductor chip 230 and the conductive spacer 240 may be vertically connected and disposed between the lower ceramic substrate 210 and the upper ceramic substrate 220. Subsequently, the inverter power module 200 may be manufactured by surrounding the lower ceramic substrate 210, the upper ceramic substrate 220, the semiconductor chip 230, and the conductive spacer 240 with the mold compound 250 to form a packaged unit, bonding the first heat dissipation plate 260 to the lower surface of the lower ceramic substrate 210, and bonding the second heat dissipation plate 270 to the upper surface of the upper ceramic substrate 220.

The inverter power module 200 further includes a lead frame 245 that is bonded to the metal pattern 212 on the upper surface of the lower ceramic substrate 210 and extends outward. An end of the lead frame 245 extending outward is connected to a terminal responsible for input and output of power. Specifically, the end of the lead frame 245 extending outward is exposed to the outside of the mold compound 250 that surrounds and integrates the lower ceramic substrate 210, the upper ceramic substrate 220, the semiconductor chip 230, and the conductive spacer 240 and is connected to the terminal responsible for input and output of power.

The inverter power module 200 of the another embodiment described above increases efficiency by using a SiC chip as a semiconductor chip, improves process stabilization and reliability by using an AMB substrate, and dissipates heat generated from the semiconductor chip on both top and bottom sides by vertically disposing a semiconductor chip and a conductive spacer between two AMB substrates, thereby achieving excellent heat dissipation efficiency and high reliability.

The inverter power module 200 of another embodiment can increase heat dissipation efficiency by applying the thermal interface materials 261 and 271 to the heat dissipation plates 260 and 270 to lower thermal resistance.

FIG. 5 is a view illustrating the cross-sectional structure of a modified example of an inverter power module 200*a* according to another embodiment of the present disclosure.

As illustrated in FIG. 5, in the inverter power module 200*a*, which is the modified example of another embodiment, the first heat dissipation plate 260 and the second heat dissipation plate 270 may be formed in the shape of a heat sink. The first heat dissipation plate 260 and the second heat dissipation plate 270 in the shape of a heat sink are each provided on the surface thereof with protrusions at regular intervals and increases a surface area through which heat is dissipated, thereby enabling efficient heat dissipation.

The first heat dissipation plate 260 and the second heat dissipation plate 270 include the thermal transfer materials 261 and 271, respectively, thereby lowering thermal resistance to increase heat dissipation efficiency.

The inverter power modules of the above-mentioned embodiment and other embodiments can be used interchangeably, and can be used for inverter control of home appliances such as air conditioners and refrigerators, or for power conversion and control in elevators of skyscrapers, railways, and hybrid electric vehicles.

In particular, the inverter power modules of the embodiment and other embodiments can be easily applied to an inverter for a small BLDC motor of an electric vehicle.

The best embodiments of the present disclosure are disclosed in the drawings and specification. Here, specific terms are used, but they are used only for the purpose of describing the present disclosure and are not used to limit the meaning or scope of the present disclosure defined in the claims. Therefore, those skilled in the art will appreciate that various modifications and equivalent other embodiments of the present disclosure are possible therefrom. Accordingly, the true technical scope of the present disclosure should be determined by the technical spirit of the appended claims.

The invention claimed is:

1. An inverter power module comprising:
- a ceramic substrate;
- an LTCC substrate disposed to be spaced apart from an upper portion of the ceramic substrate;
- a semiconductor chip having a lower surface bonded to a metal pattern on an upper surface of the ceramic substrate and an upper surface bonded to an external electrode of the LTCC substrate; and
- a heat dissipation plate bonded to a lower surface of the ceramic substrate,
  - wherein the heat dissipation plate is formed therein with a plurality of spaces arranged in a vertical direction or a horizontal direction, and a thermal interface material (TIM) is applied to the plurality of spaces formed inside the heat dissipation plate, and
  - wherein the heat dissipation plate is provided on a surface thereof with protrusions at positions corresponding to the spaces to which the TIM is applied.

2. The inverter power module of claim 1, wherein the ceramic substrate is an active metal brazing (AMB) substrate.

3. The inverter power module of claim 1, wherein the semiconductor chip is a SiC chip.

4. The inverter power module of claim 1, further comprising:
- a bonding layer configured to bond a surface electrode on a lower surface of the semiconductor chip to the metal pattern on the upper surface of the ceramic substrate; and
- an adhesive layer configured to bond a signal transmission electrode on an upper surface of the semiconductor chip to an external electrode on a lower surface of the LTCC substrate.

5. The inverter power module of claim 4, wherein the bonding layer is made of silver nanopaste, and the adhesive layer is made of silver nanopaste or solder.

6. The inverter power module of claim 1, further comprising:
- a circuit protection element (MLCC) mounted on an upper surface of the LTCC substrate,
- wherein the circuit protection element is connected to a signal transmission electrode on an upper surface of the semiconductor chip through an external electrode connected to an internal electrode of the LTCC substrate.

7. The inverter power module of claim 1, further comprising:
- a lead frame bonded to the metal pattern on the upper surface of the ceramic substrate and extending outward; and
- a mold compound configured to surround and integrate the ceramic substrate, the LTCC substrate, and the semiconductor chip and to expose an end of the lead frame to an outside.

8. An inverter power module comprising:
- a lower ceramic substrate;
- an upper ceramic substrate disposed to be spaced apart from an upper portion of the lower ceramic substrate;
- a semiconductor chip bonded to a metal pattern on an upper surface of the lower ceramic substrate;

a conductive spacer installed between the semiconductor chip and the upper ceramic substrate to connect a signal transmission electrode on an upper surface of the semiconductor chip and a metal pattern on a lower surface of the upper ceramic substrate;

a first heat dissipation plate bonded to a lower surface of the lower ceramic substrate; and a second heat dissipation plate bonded to an upper surface of the upper ceramic substrate, wherein the first heat dissipation plate and the second heat dissipation plate are each formed therein with a plurality of spaces arranged in a vertical direction or a horizontal direction, and a thermal interface material (TIM) is applied to the plurality of spaces formed inside each of the first heat dissipation plate and the second heat dissipation plate, and wherein the first heat dissipation plate and the second heat dissipation plate are each provided on a surface thereof with protrusions at positions corresponding to the spaces to which the TIM is applied.

9. The inverter power module of claim 8, wherein the upper ceramic substrate and the lower ceramic substrate are each an active metal brazing (AMB) substrate.

10. The inverter power module of claim 8, wherein the semiconductor chip is a SiC chip.

11. The inverter power module of claim 8, further comprising:

a bonding layer configured to bond a surface electrode of the semiconductor chip to a metal pattern on the upper surface of the lower ceramic substrate;

a first adhesive layer configured to bond the signal transmission electrode on the upper surface of the semiconductor chip to a lower surface of the conductive spacer; and a second adhesive layer configured to bond an upper surface of the conductive spacer to a metal pattern on the lower surface of the upper ceramic substrate.

12. The inverter power module of claim 11, wherein the bonding layer, the first adhesive layer, and the second adhesive layer are each made of silver nanopaste.

13. The inverter power module of claim 8, further comprising:

a lead frame bonded to the metal pattern on the upper surface of the lower ceramic substrate and extending outward; and a mold compound configured to surround and integrate the lower ceramic substrate, the upper ceramic substrate, the semiconductor chip, and the conductive spacer and to expose an end of the lead frame to an outside.

* * * * *